United States Patent
Kuo et al.

(10) Patent No.: US 11,515,398 B2
(45) Date of Patent: Nov. 29, 2022

(54) THIN POLY FIELD PLATE DESIGN

(71) Applicant: Taiwan Semiconductor Manufacturing Co., Ltd., Hsin-Chu (TW)

(72) Inventors: Chien-Li Kuo, Hsinchu (TW); Scott Liu, Hsinchu (TW); Po-Wei Chen, Hsinchu (TW); Shih-Hsiang Tai, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/005,513

(22) Filed: Aug. 28, 2020

(65) Prior Publication Data
US 2020/0395451 A1    Dec. 17, 2020

Related U.S. Application Data

(63) Continuation of application No. 15/170,315, filed on Jun. 1, 2016, now Pat. No. 10,825,905.

(51) Int. Cl.
*H01L 29/66* (2006.01)
*H01L 29/78* (2006.01)
(Continued)

(52) U.S. Cl.
CPC .......... *H01L 29/665* (2013.01); *H01L 29/402* (2013.01); *H01L 29/66659* (2013.01);
(Continued)

(58) Field of Classification Search
CPC ......... H01L 29/66681; H01L 29/66689; H01L 29/66659; H01L 29/66325; H01L 29/7816;
(Continued)

(56) References Cited

U.S. PATENT DOCUMENTS 6,683,349 B1 * 1/2004 Taniguchi ........... H01L 29/7835
257/E29.268
9,343,572 B1    5/2016 Lao et al.
(Continued)

FOREIGN PATENT DOCUMENTS

JP        2012109425 A      6/2012

OTHER PUBLICATIONS

Non-Final Office Action dated Aug. 25, 2017 for U.S. Appl. No. 15/170,315.
(Continued)

*Primary Examiner* — Jesse Y Miyoshi
(74) *Attorney, Agent, or Firm* — Eschweiler & Potashnik, LLC (57) ABSTRACT

The present disclosure relates to a transistor device having source and drain regions within a substrate. A gate electrode is between the source and drain regions. A spacer has a lower lateral portion along an upper surface of the substrate between the gate electrode and the drain region, a vertical portion extending along a sidewall of the gate electrode, and an upper lateral portion extending from the vertical portion to an outermost sidewall directly over the gate electrode. A field plate is disposed along an upper surface and a sidewall of the spacer and is separated from the gate electrode and the substrate by the spacer. A first ILD layer overlies the substrate, the gate electrode, and the field plate. A first conductive contact has opposing outermost sidewalls intersecting a first horizontally extending surface of the field plate between the gate electrode and the drain region.

20 Claims, 6 Drawing Sheets

(51) Int. Cl.
*H01L 29/40* (2006.01)
*H01L 29/10* (2006.01)

(52) U.S. Cl.
CPC .. *H01L 29/66681* (2013.01); *H01L 29/66689* (2013.01); *H01L 29/7816* (2013.01); *H01L 29/7835* (2013.01); *H01L 29/1083* (2013.01)

(58) Field of Classification Search
CPC ............. H01L 29/7393; H01L 29/7835; H01L 29/402
See application file for complete search history.

(56) References Cited

U.S. PATENT DOCUMENTS

| | | | |
|---|---|---|---|
| 2006/0261378 A1 | 11/2006 | Moscatelli et al. | |
| 2008/0213965 A1* | 9/2008 | Yoon | H01L 29/66659 438/305 |
| 2009/0218622 A1* | 9/2009 | Rijs | H01L 29/7835 438/286 |
| 2012/0126323 A1 | 5/2012 | Wu et al. | |
| 2013/0134512 A1* | 5/2013 | Cheng | H01L 29/402 257/E29.256 |
| 2013/0277741 A1 | 10/2013 | Guowei et al. | |
| 2014/0131796 A1* | 5/2014 | Zhou | H01L 29/66681 438/286 |
| 2014/0159153 A1 | 6/2014 | Qian | |
| 2014/0191317 A1 | 7/2014 | Qian et al. | |
| 2014/0197489 A1 | 7/2014 | Chu et al. | |
| 2014/0264581 A1* | 9/2014 | Chan | H01L 29/0878 438/289 |
| 2014/0264586 A1* | 9/2014 | Moon | H01L 29/7818 438/237 |
| 2015/0048448 A1 | 2/2015 | Chen et al. | |
| 2016/0172245 A1 | 6/2016 | Babcock et al. | |
| 2016/0172490 A1 | 6/2016 | Lao et al. | |

OTHER PUBLICATIONS

Final Office Action dated Mar. 16, 2018 for U.S. Appl. No. 15/170,315.
Non-Final Office Action dated Mar. 29, 2019 for U.S. Appl. No. 15/170,315.
Final Office Action dated Jul. 31, 2019 for U.S. Appl. No. 15/170,315.
Non-Final Office Action dated Jan. 14, 2020 for U.S. Appl. No. 15/170,315.
Notice of Allowance dated Jun. 17, 2020 for U.S. Appl. No. 15/170,315.

* cited by examiner

THIN POLY FIELD PLATE DESIGN

REFERENCE TO RELATED APPLICATION

This Application is a Continuation of U.S. application Ser. No. 15/170,315, filed on Jun. 1, 2016, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field plate is a conductive plate that is constructed in a high voltage transistor device and that increases a breakdown voltage of the transistor device. The field plate can be arranged over a channel region and/or a drift region, and provides an extended edge for the electrical field lines and a wider depletion region beneath a gate. Thus, the field plate spreads an electric field generated by a gate more uniformly and a greater breakdown voltage is achieved.

Field plates can be formed by forming a metal layer over a dielectric layer. For example, the dielectric layer can be formed over the drift region followed by forming an inter-level dielectric layer. Then a big contact hole can be formed directly above the dielectric layer through the inter-level dielectric layer concurrent with forming contact holes directly above source/drain or gate regions. A metal material is then filled into the big contact hole and the contact holes to form a field plate and contacts for source/drain or gate regions. However, it is challenging to form the big contact hole while not damaging the dielectric layer and to form a field plate uniformly landing on the dielectric layer. Also, the breakdown voltages of transistor devices are hard to be precisely controlled and may vary one from another transistor as a result of using the above field plate formation approach.

The present disclosure relates to a high voltage transistor device having a thin polysilicon film field plate, and an associated method of formation. By forming and patterning a thin polysilicon film layer to form a field plate, the stability and uniformity of the breakdown voltages of transistors are improved. The high voltage transistor device has a source region and a drain region disposed within a substrate. A gate electrode is disposed between the source region and the drain region and is separated from the substrate by a gate dielectric. A spacer is disposed along an upper surface of the substrate between the gate electrode and the drain region. The spacer extends along a first gate sidewall closer to the drain region, crosses over an upper edge of the gate electrode, and further extends laterally to cover a portion of an upper surface of the gate electrode. A field plate comprising a polysilicon thin film is disposed along upper and sidewall surfaces of the spacer, so that the polysilicon thin film is separated from the gate electrode and the substrate by the spacer.

Figure 1:
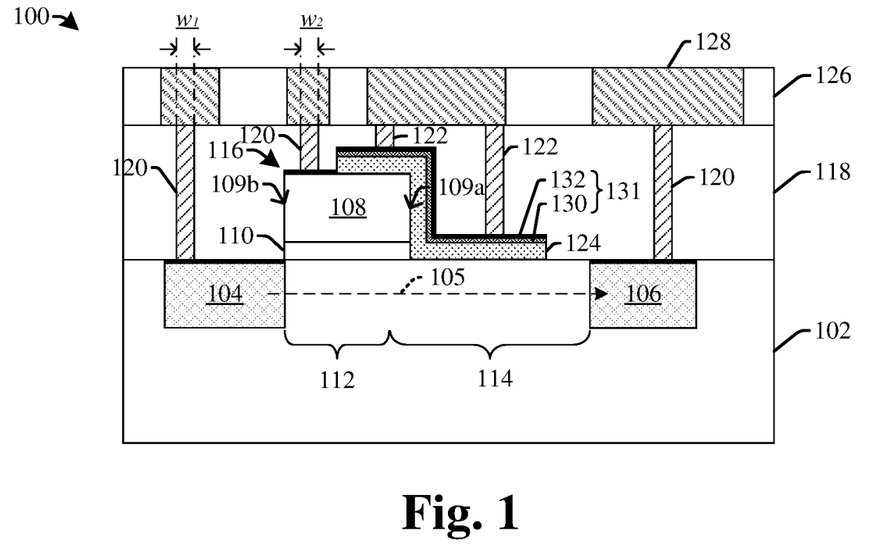
FIG. 1 illustrates a cross-sectional view of some embodiments of a transistor device having a field plate.

FIG. 1 illustrates a cross-sectional view of some embodiments of a high voltage transistor device 100 having a field plate 131. The high voltage transistor device 100 comprises a source region 104 and a drain region 106 disposed within a substrate 102. A gate structure 116 is disposed over the substrate 102 at a position that is laterally arranged between the source region 104 and the drain region 106. The gate structure 116 comprises a gate electrode 108 that is separated from the substrate 102 by a gate dielectric 110. In some embodiments, between the source region 104 and the drain region 106, a channel region 112 laterally extends from the source region 104 to a drift region 114 (e.g., a drain extension region). The gate structure 116 is disposed over the channel region 112.

A spacer 124 is disposed over the drift region 114 along an upper surface of the substrate 102. The spacer 124 extends along a first gate sidewall 109a closer to the drain region 106, crosses over an upper edge of the gate electrode 108, and further extends laterally to cover a portion of an upper surface of the gate electrode 108. A field plate 131 is disposed along an upper and sidewall surfaces of the spacer 124. The field plate 131 includes an upper lateral portion overlying the gate electrode 108, and a lower lateral portion that is laterally adjacent to the gate electrode 108 and that is connected to upper lateral portion by a vertical portion. The field plate 131 comprises a polysilicon thin film 130 separated from the gate electrode 108 and the drift region 114 by the spacer 124. In some embodiments, a portion of the field plate 131 further comprises a conductive layer 132, for example a metal silicide layer, covering surfaces of the polysilicon thin film 130 that faces away from the spacer 124.

In some embodiments, a first inter-level dielectric (ILD) layer 118 is disposed over the substrate 102, the gate electrode 108, and the field plate 131. A first plurality of contacts 120 vertically extend through the first ILD layer 118. The first plurality of contacts 120 are respectively coupled to the source region 104, the drain region 106, and the gate electrode 108. A second plurality of contacts 122 extend through the first ILD layer 118 and are coupled to the field plate 131. In some embodiments, the first plurality of contacts 120 has a first width $w_1$ that is substantially equal to a second width $w_2$ of the second plurality of contacts 122. In other embodiments, the first plurality of contacts 120 has a first width that is smaller than a second width of the second plurality of contacts 122. In some embodiments, a second ILD layer 126 is disposed over the first ILD layer 118. A plurality of metal lines 128 are disposed within the second ILD layer 126 and electrically couple the field plate 131 to the source region 104, the drain region 106, or the gate electrode 108 through the first plurality of contacts 120 and the second plurality of contacts 122.

Upon receiving a bias voltage, the gate electrode 108 is configured to generate an electric field that controls the movement of charge carriers within the channel region 112. For example, during operation, a gate-source voltage (VGS) can be selectively applied to the gate electrode 108 relative to the source region 104, forming a conductive channel in the channel region 112. While VGS is applied to form the conductive channel, a drain to source voltage (VDS) is applied to move charge carriers (e.g., shown by arrow 105) between the source region 104 and the drain region 106. The field plate 131 is configured to modulate a distribution of the electric field generated by the gate electrode 108 in the drift region 114, thereby enhancing the breakdown voltage capability of the high voltage transistor device 100. By arranging the field plate 131 conformally overlying the gate electrode 108 and the drift region 114, an electrical field generated by the gate region 116 can be reliably modulated during the operation of the high voltage transistor device 100, thereby improving the breakdown voltage.

Figure 2:
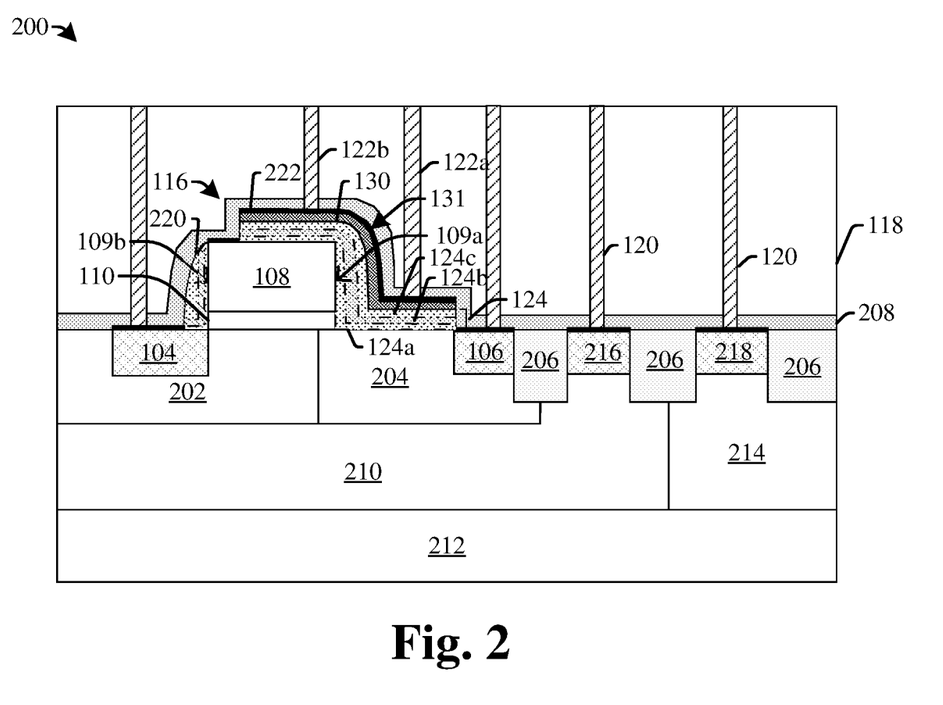
FIG. 2 illustrates a cross-sectional view of some additional embodiments of a high voltage transistor device having a field plate.

FIG. 2 illustrates a cross-sectional view of some additional embodiments of a high voltage transistor device 200 having a field plate 131. The high voltage transistor device 200 comprises a source region 104, a body region 202, a drain region 106, and a drift region 204. The high voltage transistor device 200 further comprises a first deep well 210 and an oppositely doped underlying buried layer 212 configured to provide vertical isolation. The high voltage transistor device 200 further comprises one or more additional STI regions 206 that laterally separate the drain region 106 from a first well contact 216 and a buried layer contact 218. The first well contact 216 overlies the first deep well 210 and the buried layer contact 218 overlies a second deep well 214. The first deep well 210 and the second deep well 214 abut the buried layer 212 and have opposite doping types. In some embodiments, contacts 120 are configured to provide for biasing voltages to the first deep well 210 and the second deep well 214. The junction isolation allows full isolation for the high voltage transistor device 200 to operate over a range of bias voltages.

In some embodiments, the source region 104 and the drain region 106 may have a first doping type with doping concentrations that are in a range of between approximately $10^{19}$ cm$^{-3}$ and approximately $10^{20}$ cm$^{-3}$. The drift region 204 may have the first doping type with a doping concentration lower than the source region 104 and the drain region 106, which provides for a higher resistance when the high voltage transistor device 200 is operated at a high voltage. In some embodiments, the drift region 204 may have a doping concentration that is in a range of between approximately $10^{15}$ cm$^{-3}$ and approximately $10^{17}$ cm$^{-3}$. The body region 202 has a second doping type with a doping concentration higher than that of the first deep well 210. For example, the first deep well 210 may have a doping concentration that is in a range of between approximately $10^{14}$ cm$^{-3}$ and approximately $10^{16}$ cm$^{-3}$, while the body region 202 may have a doping concentration that is in a range of between approximately $10^{16}$ cm$^{-3}$ and approximately $10^{18}$ cm$^{-3}$. In some embodiments, the first well contact 216 may have the second doping type and the buried layer contact 218 may have the first doping type with doping concentrations that are in a range of between approximately $10^{19}$ cm$^{-3}$ and approximately $10^{20}$ cm$^{-3}$.

In some embodiments, a gate structure 116 is disposed over the body region 202 at a position that is laterally arranged between the source region 104 and the drain region 106. In some embodiments, the gate structure 116 may laterally extend from over the body region 202 to a position overlying a portion of the drift region 204. The gate structure 116 comprises a gate electrode 108 that is separated from the drift region 204 by a gate dielectric 110. In some embodiments, the gate dielectric 110 may comprise silicon dioxide (SiO$_2$) or a high-k gate dielectric material. The gate electrode 108 may comprise highly doped polysilicon or a metal gate material (e.g., aluminum).

A spacer 124 is disposed along a first gate sidewall 109a closer to the drain region 106. In some embodiments, the spacer 124 continuously extends laterally along a portion of the drift region 204 and a portion of a top surface of the gate electrode 108. In some embodiments, the spacer 124 may be conformally disposed onto the drift region 204 and the gate electrode 108. In some embodiments, a sidewall spacer 220 is disposed along a second gate sidewall 109b closer to the source region 104. The sidewall spacer 220 may comprise the same material of the spacer 124. In some embodiments, the spacer 124 and/or the sidewall spacer 220 comprise a first oxide layer 124a, a nitride layer 124b disposed on the first oxide layer 124a, and a second oxide layer 124c disposed on the nitride layer 124b.

A field plate 131 is conformally arranged over upper and sidewall surfaces of the spacer 124. The field plate 131 includes a polysilicon thin film 130 and a cobalt silicide layer 222 stacked on the polysilicon thin film 130. In some embodiments, outermost sidewalls of the spacer 124 and the field plate 131 are vertically aligned.

In some embodiments, a contact etch stop layer (CESL) 208 is disposed along upper surfaces of the source region 104 and the drain region 106, an upper surface of the field plate 131, an upper surface of the gate electrode 108 not covered by the field plate 131, and a second gate sidewall 109b at an opposite side to the spacer 124. A first ILD layer 118 is disposed over the CESL 208. The first ILD layer 118 may comprise a dielectric material having a relatively low dielectric constant (e.g., less than or equal to approximately 3.9), which provides for electrical isolation between a first plurality of contacts 120 coupled to the source region 104, the drain region 106 or the gate electrode 108, and a second plurality of contacts 122 coupled to the field plate 131. In some embodiments, the first ILD layer 118 may comprise an ultra-low k dielectric material or a porous low-k dielectric material. In some embodiments, the second plurality of contacts 122 comprise a first metal contact 122a contacting a lower planar portion of the field plate 131, and a second metal contact 122b, which is laterally offset from the first metal contact 122a and that contacts an upper planar portion of the field plate 131 that is vertically offset from the lower planar portion. In some embodiments, the plurality of contacts 120, 122 may comprise the same metal material. For example, the plurality of contacts 120, 122 may comprise one or more of tungsten (W), tantalum-nitride (TaN), titanium (Ti), titanium-nitride (TiN), aluminum copper (AlCu), copper (Cu), and/or other similar conductive materials.

Figure 3:
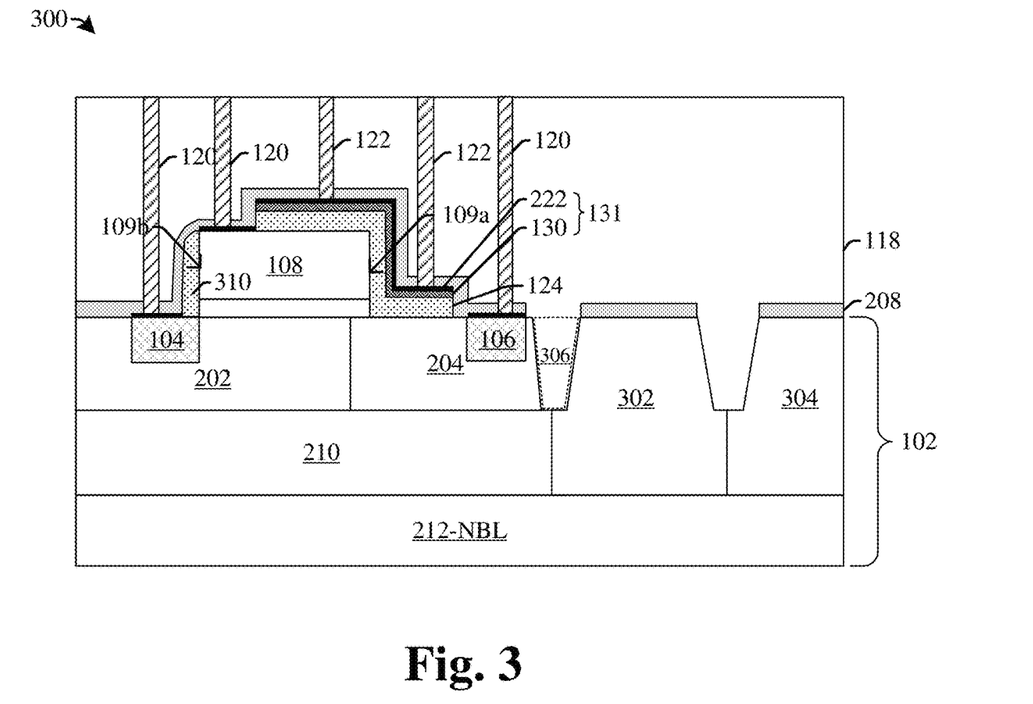
FIG. 3 illustrates a cross-sectional view of some embodiments of a high voltage transistor device having a field plate.

FIG. 3 illustrates a cross-sectional view of some additional embodiments of a high voltage transistor device 300 having a field plate 131. As shown in FIG. 3, the high voltage transistor device 300 comprises a source region 104 and a drain region 106 disposed within a substrate 102 and separated by a body region 202. A gate electrode 108 is disposed over the body region 202 at a position that is laterally between the source region 104 and the drain region 106 and that is vertically separated from the substrate 102 by a gate dielectric 110. In some embodiments, the body region 202 has a first doping type, while the source region 104 and the drain region 106 have a second doping type, with a higher doping concentration than the body region 202. In some embodiments, the drift region 114 comprises the second doping type having a lower doping concentration than the source region 104 and the drain region 106, which provides for a higher resistance at high operating voltages. In some embodiments, the first doping type may be a p-type doping and the second doping type may be an n-type doping, or vice versa. In some alternative embodiments, the substrate 102 is a bulk silicon substrate with varies doping regions. In some alternative embodiments, the substrate 102 can be implemented as a binary compound substrate (e.g., GaAs wafer), a ternary compound substrate (e.g., AlGaAs), or higher order compound wafers, among others. Further, the substrate 102 can also include non semiconductor materials such as oxide in silicon-on-insulator (SOI), partial SOI substrate, polysilicon, amorphous silicon, or organic materials, among others. In some embodiments, the substrate 102 can include multiple wafers or dies which are stacked or otherwise adhered together. The substrate 102 can include wafers which are cut from a silicon ingot, and/or any other type of semiconductor/non-semiconductor and/or deposited or grown (e.g. epitaxial) layers formed on an underlying substrate.

The high voltage transistor device 300 further comprises a spacer 124 extending along a first gate sidewall 109a and overlying a drift region 204 and the gate electrode 108. The field plate 131 is conformally disposed on the spacer 124 and includes a polysilicon thin film 130 and a cobalt silicide layer 222. A sidewall spacer 310 is disposed along a second gate sidewall 109b. The spacer 124 and the sidewall spacer 310 may be made of the same material. A plurality of contacts 120, 122 are disposed within a first ILD layer 118 and respectively coupled to the source region 104, the drain region 106, the gate electrode 108 and the field plate 131 through a contact etch stop layer (CESL) 208. In some embodiments, the first ILD layer 118 includes a trench portion 306 extending through the CESL 208 to isolate the drain region 106 from a first doped region 302 and a second doped region 304 having different doping types. The first doped region 302 and the second doped region 304 abut one another and act as a junction isolation structure to provide a lateral isolation for the high voltage transistor device 300. In some embodiments, the trench portion 306 of the first ILD layer 118 has a bottom surface aligned with a bottom surface of the drift region 204. In some embodiments, the first doped region 302 and the second doped region 304 over a buried layer 212, which is disposed under a first deep well 210. The first deep well 210 may arranged in contact with the first doped region 302.

FIGS. 4-11 illustrate cross-sectional views of some embodiments showing a method of forming a high voltage transistor device having a field plate.

Figure 4:
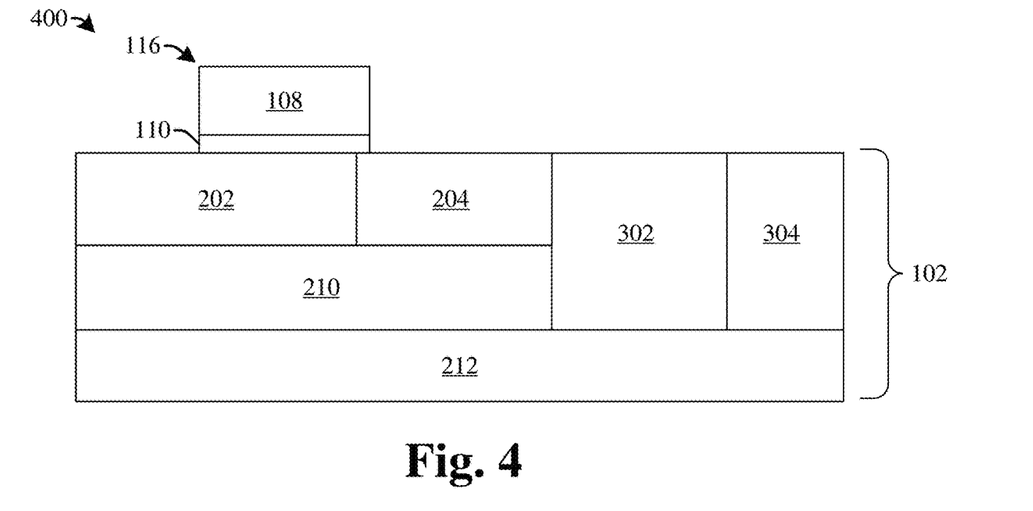
FIGS. 4-11 illustrate cross-sectional views of some embodiments showing a method of forming a high voltage transistor device having a field plate.

As shown in cross-sectional view 400 of FIG. 4, a substrate 102 is selectively doped using various diffusion and/or ion implantation steps to form a plurality of doped regions (e.g., well regions, contact regions, etc.). The plurality of doped regions may be formed by selectively masking the substrate 102 (e.g., using a photoresist mask) and then introducing high-energy dopants (e.g., p-type dopant species such as boron or n-type dopants such as phosphorous) into exposed areas of the substrate 102. For example, a first deep well 210 and an oppositely doped underlying buried layer 212 can be formed within the substrate 102. The substrate 102 can be further doped to form a body region 202 and a drift region 204 over the first deep well 210. In some embodiments, an isolation structure can be formed over the buried layer 212 at a location that is laterally adjacent to the body region 202 and the drift region 204. The isolation structure may include a first doped region 302 and a second doped region 304 abutting one another and having different doping types, to provide isolation for the high voltage transistor device to be formed.

A gate structure 116 is formed over the substrate 102. The gate structure 116 comprises a gate dielectric 110 and a gate electrode 108 arranged over the gate dielectric layer 110. In some embodiments, the gate dielectric 110 and the gate electrode 108 may be formed by depositing a gate dielectric layer and a gate electrode material by a vapor deposition technique followed by subsequent patterning and etching (e.g., according to a photoresist mask) processes to define the gate structure 116.

Figure 5:
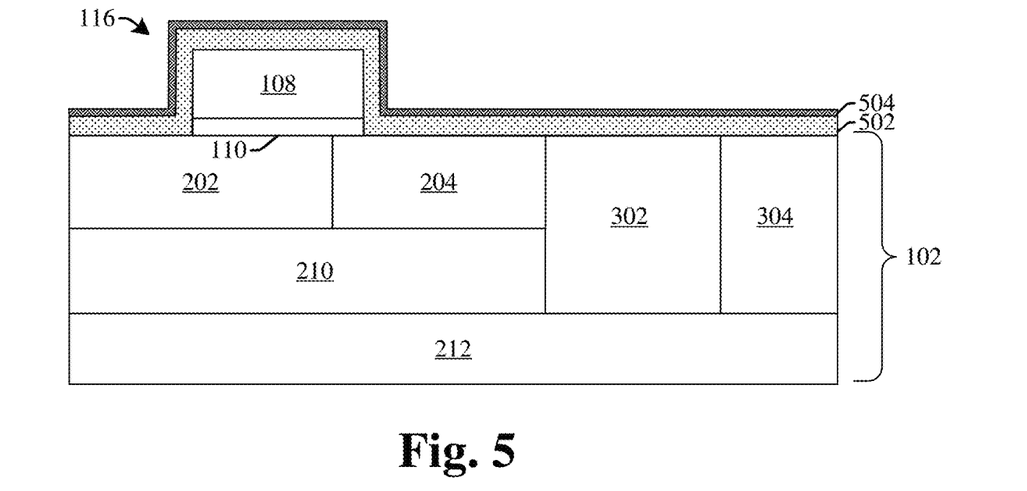

As shown in cross-sectional view 500 of FIG. 5, a spacer layer 502 and a polysilicon thin film layer 504 are formed in succession along an upper surface of the substrate 102. The spacer layer 502 and the polysilicon thin film layer 504 extend along sidewalls of the gate structure 116, and cross over an upper surface of the gate structure 116. The spacer layer 502 and the polysilicon thin film layer 504 may be formed conformally over the substrate 102 and the gate structure 116. In some embodiments, the spacer layer 502 includes one or more dielectric layers, such as a first oxide layer, a nitride layer and a second oxide layer deposited in that order and by a vapor deposition technique. The polysilicon thin film layer 504 may be an intrinsic film formed by a vapor deposition technique, such as a physical vapor deposition process or a chemical vapor deposition process. In some embodiments, the polysilicon thin film layer 504 is formed to have a thickness that is less than a thickness of the spacer layer 502. For example, in some embodiments, the polysilicon thin film layer 504 may have a thickness in range of from about 30 Å to about 3000 Å.

Figure 6:
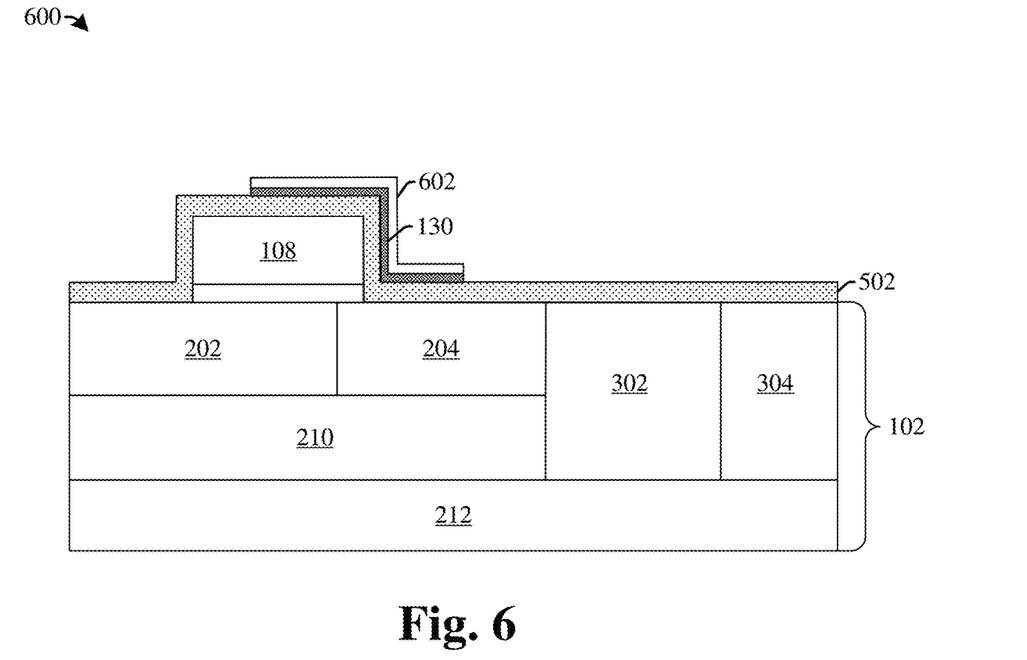

As shown in cross-sectional view 600 of FIG. 6, the polysilicon thin film layer 504 (shown in FIG. 5) is patterned (e.g., according to a photoresist mask or a hard mask) to form a polysilicon thin film 130. In some embodiments, the polysilicon thin film layer 504 may be etched according to a mask 602 using a wet etch or an isotropic dry etch, such that the polysilicon thin film layer 504 can be removed from unwanted positions. In such embodiments, the mask 602 is formed onto the polysilicon thin film layer 504 and then parts of the polysilicon thin film layer 504 not covered by the mask 602 are removed by etching. In other embodiments, the polysilicon thin film layer 504 may be patterned by a photolithography patterning process that uses a photoresist mask. The polysilicon thin film layer 504 may be etched to leave an upper lateral portion overlying a portion of the gate electrode 108 and a lower lateral portion overlying the drift region 204 and a vertical portion connecting the upper and lower lateral portions and along a sidewall of the gate structure 116.

Figure 7:
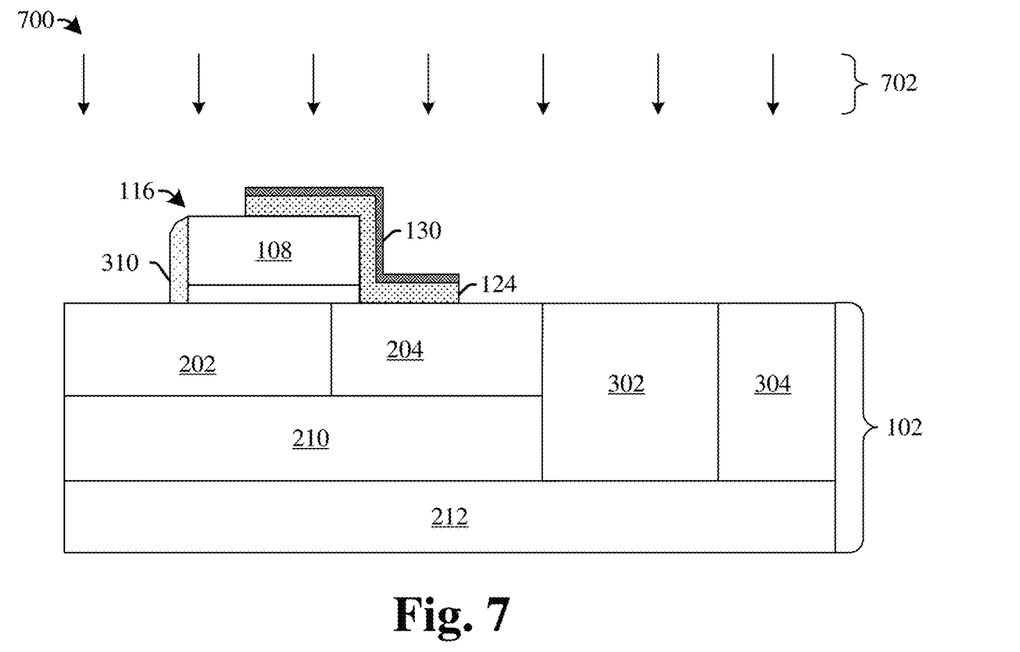

As shown in cross-sectional view 700 of FIG. 7, the spacer layer 502 (shown in FIG. 6) is patterned and etched to form a spacer 124 and a sidewall spacer 310. In some embodiments, the spacer layer 502 is patterned according to the polysilicon thin film 130. The spacer layer 502 may be etched using an anisotropic dry etch 702, for example a vertical etch. The spacer 124 is protected from being etched by the polysilicon thin film 130 along one side of the gate electrode 108. The sidewall spacer 310 is left along another side of the gate electrode 108. As a patterning result, the spacer 124 has sidewalls vertically aligned with sidewalls of the polysilicon thin film 130.

Figure 8:
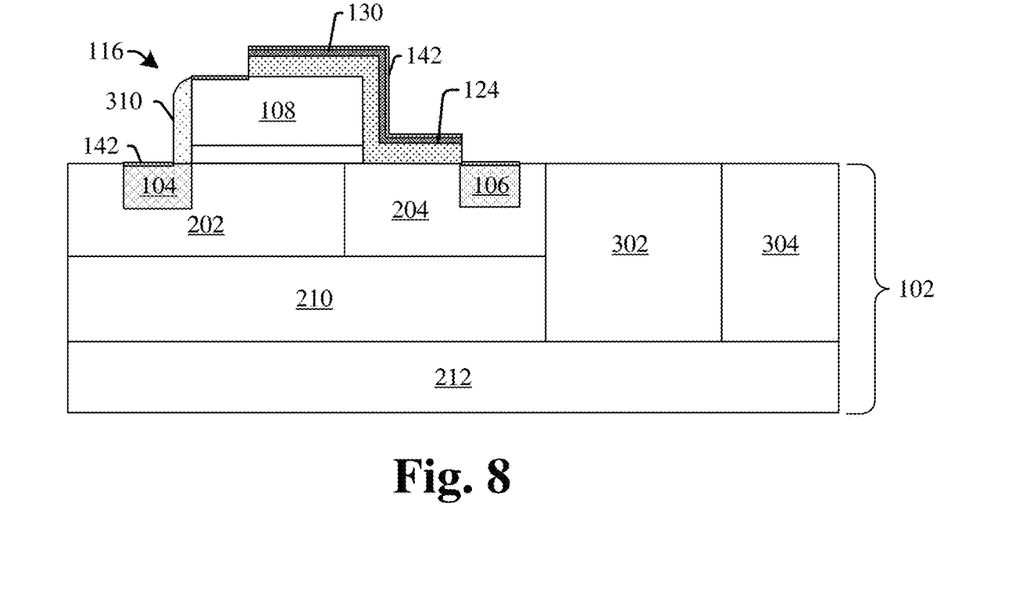

As shown in cross-sectional view 800 of FIG. 8, source/drain regions 104, 106 are formed alongside the gate structure 116 within the body region 202 and the drift region 204, respectively. In some embodiments, the source/drain regions 104, 106 may be formed by an implantation process that selectively implants higher concentrations of a dopant, such as boron (B) or phosphorous (P) for example, within the body region 202 and the drift region 204. In some other embodiments, the source/drain regions 104, 106 may be formed by performing an etch process to form a trench followed by an epitaxial growth process. In such embodiments, the source/drain regions 104, 106 may have a raised portion that is higher than the upper surface of the substrate 102.

In some embodiments, one or more salicidation processes are performed to form a silicide layer 142 on upper surfaces of the source/drain regions 104, 106, the gate electrode 108 and the polysilicon thin film 130. In some embodiments, the salicidation process may be performed by depositing a metal material, such as nickel or cobalt, and then performing a thermal annealing process (e.g., a rapid thermal anneal). In some embodiments, a first silicide process may be used to form the silicide layer 142 onto the source/drain regions 104, 106, and a second silicide process may be used to form the silicide layer 142 onto the polysilicon thin film 130.

Figure 9:
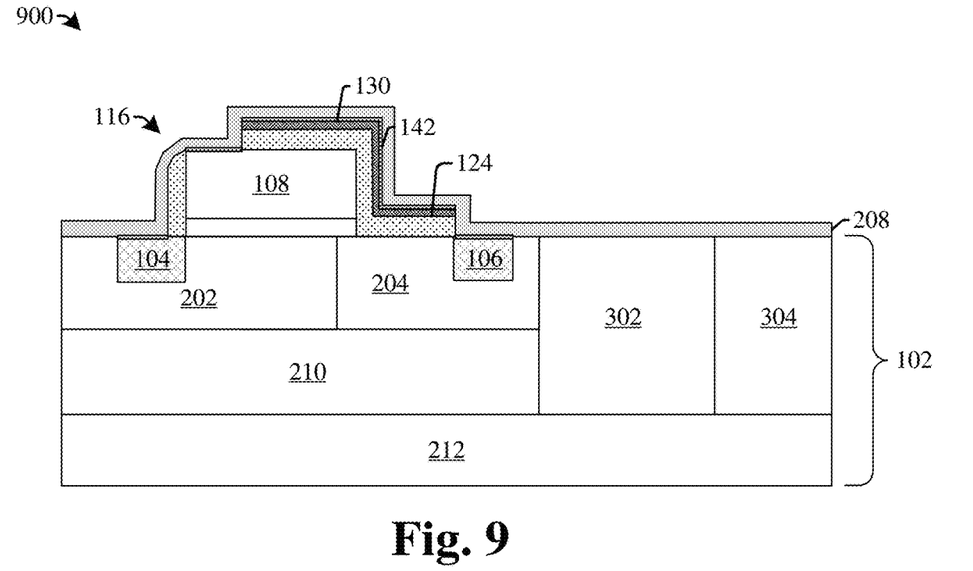

As shown in cross-sectional view 900 of FIG. 9, a contact etch stop layer 208 is formed conformally over the source/drain regions 104, 106 and extends along the gate structure 116 and the polysilicon thin film 130. In some embodiments, the contact etch stop layer 208 may comprise silicon nitride formed by way of a deposition process (e.g., CVD, PVD, etc.).

Figure 10:
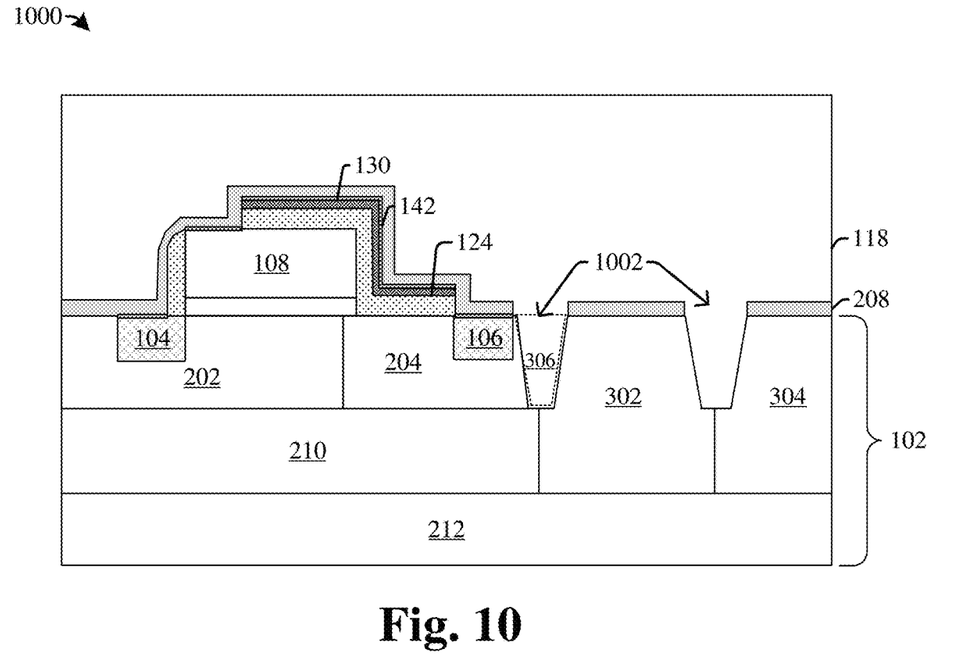

As shown in cross-sectional view 1000 of FIG. 10, a first inter-layer dielectric (ILD) layer 118 is formed over the contact etch stop layer 208. In some embodiments, the first inter-layer dielectric layer 118 may comprise a low-k dielectric layer, formed by way of a deposition process (e.g., CVD, PVD, etc.). In some embodiments, prior to forming the first inter-layer dielectric layer 118, a plurality of trenches 1002 is formed through the contact etch stop layer 208 within the substrate 102. In some embodiments, the plurality of trenches 1002 can be formed between the drift region 204 and the first doped region 302, and between the first doped region 302 and a second doped region 304. The plurality of trenches 1002 may be etched by an angled dry etch (e.g. a plasma etching process). The plurality of trenches 1002 is then filled by the first inter-layer dielectric layer 118.

Figure 11:
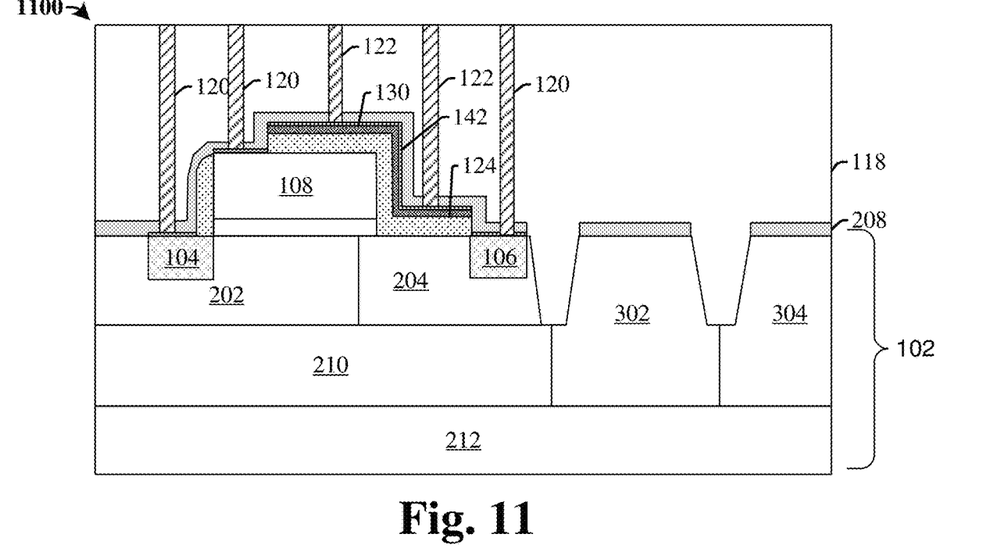

As shown in cross-sectional view 1100 of FIG. 11, contacts 120, 122 are formed through the first inter-layer dielectric layer 118 and extend downward to the source/drain regions 104, 106, the gate electrode 108 and the polysilicon thin film 130. The contacts 120, 122 may be formed by selectively etching the first inter-layer dielectric layer 118 to form openings (e.g. with a patterned photoresist mask in place), and by subsequently depositing a conductive material within the openings. A planarization process may be subsequently performed to remove excess conductive material outside of the openings. In some embodiments, the planarization process may comprise a chemical mechanical polishing (CMP) process. In some embodiments, the openings have a substantially equal width. In some embodiments, the conductive material may comprise tungsten (W), for example.

Figure 12:
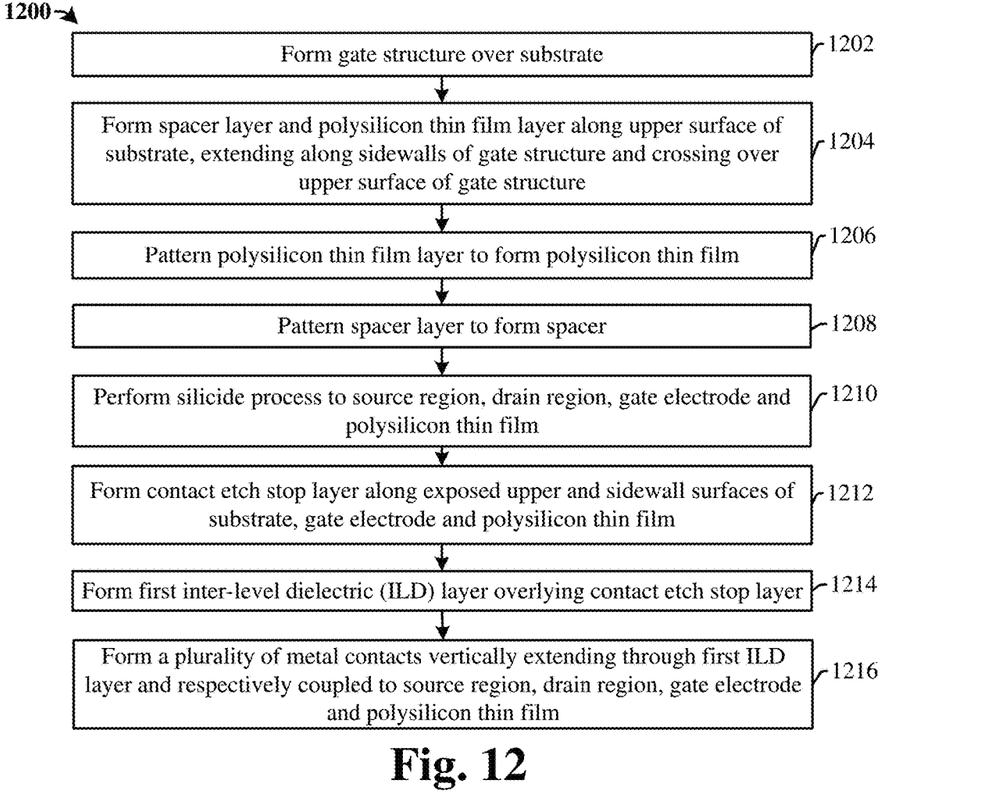
FIG. 12 illustrates a flow diagram of some embodiments of a method of forming a high voltage transistor device having a field plate.

FIG. 12 illustrates a flow diagram of some embodiments of a method 1200 of forming a high voltage transistor device having a field plate.

Although method 1200 is described in relation to FIGS. 4-11, it will be appreciated that the method 1200 is not limited to such structures, but instead may stand alone as a method independent of the structures. Furthermore, while the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a gate structure is formed over a substrate. The substrate may be selectively doped to form a plurality of active regions prior to the formation of the gate structure. FIG. 4 illustrates some embodiments of a cross-sectional view 400 corresponding to act 1202.

At 1204, a spacer layer and a polysilicon thin film layer are formed along an upper surface of the substrate. The spacer layer and the polysilicon thin film extend along sidewalls of the gate structure, and cross over an upper surface of the gate structure. In some embodiments, the spacer layer includes one or more dielectric layers deposited by a vapor deposition technique. FIG. 5 illustrates some embodiments of a cross-sectional view 500 corresponding to act 1204.

At 1206, the polysilicon thin film layer is patterned to form a polysilicon thin film. The polysilicon thin film layer may be etched to leave an upper lateral portion overlying a portion of the gate electrode, a lower lateral portion overlying the substrate, and a vertical portion connecting the upper and lower lateral portions and along a sidewall of the gate structure. FIG. 6 illustrates some embodiments of a cross-sectional view 600 corresponding to act 1206.

At 1208, the spacer layer is patterned and etched to form a spacer. In some embodiments, the spacer layer is patterned according to the polysilicon thin film. FIG. 7 illustrates some embodiments of a cross-sectional view 700 corresponding to act 1208.

At 1210, source/drain regions are formed alongside the gate structure within the substrate. In some embodiments, a salicidation process is performed to form a silicide layer on upper surfaces of the source/drain regions, the gate electrode and the polysilicon thin film. FIG. 8 illustrates some embodiments of a cross-sectional view 800 corresponding to act 1210.

At 1212, a contact etch stop layer is formed over the source/drain regions and extends along the gate structure and the polysilicon thin film. FIG. 9 illustrates some embodiments of a cross-sectional view 900 corresponding to act 1212.

At 1214, a first inter-layer dielectric layer is formed over the contact etch stop layer. In some embodiments, a plurality of trenches is formed through the contact etch stop layer and within the substrate, which is then filled by the first inter-layer dielectric layer. FIG. 10 illustrates some embodiments of a cross-sectional view 1000 corresponding to act 1214.

At 1216, contacts are formed to extend through the first inter-layer dielectric layer and reach on the source/drain regions, the gate electrode, and the polysilicon thin film. FIG. 11 illustrates some embodiments of a cross-sectional view 1100 corresponding to act 1216.

Therefore, the present disclosure relates to a high voltage transistor device having a thin polysilicon film field plate, and an associated method of formation.

In some embodiments, the present disclosure relates to a high voltage transistor device. The high voltage transistor device comprises a source region and a drain region disposed within a substrate. The high voltage transistor device further comprises a gate electrode disposed between the source region and the drain region and separated from the substrate by a gate dielectric. The high voltage transistor device further comprises a spacer disposed along an upper surface of the substrate between the gate electrode and the drain region, extending along a first gate sidewall closer to the drain region, crossing over an upper edge of the gate electrode, and further extending laterally to cover a portion of an upper surface of the gate electrode. The high voltage transistor device further comprises a field plate comprising a polysilicon thin film and disposed along an upper surface and a sidewall of the spacer and separated from the gate electrode and the substrate by the spacer.

In some other embodiments, the present disclosure relates to a high voltage transistor device. The high voltage transistor device further comprises a substrate comprising a source region and a drain region having a first doping type and separated by a channel region having a second doping type and a gate electrode disposed between the source region and the drain region and separated from the body region by a gate dielectric. The high voltage transistor device further comprises a spacer disposed along an upper surface of the substrate, extending along a first gate sidewall, and further extending along an upper surface of the gate electrode. The high voltage transistor device further comprises a field plate comprising a polysilicon thin film and a cobalt silicide layer disposed on the polysilicon thin film and conformally disposed on the spacer, the field plate including a lower lateral portion, an upper lateral portion, and a vertical portion connecting the lower lateral portion and the upper lateral portion. The high voltage transistor device further comprises a plurality of metal contacts respectively coupled to the source region, the drain region, the gate electrode and the field plate.

In yet other embodiments, the present disclosure relates to a method of forming a high voltage transistor device. The method comprises providing a substrate having a source region and drain region formed within the substrate and a gate electrode formed between the source region and the drain region and separated from the substrate by a gate dielectric. The method further comprises forming one or more dielectric layers along an upper surface of the substrate, extending upwardly along sidewalls of the gate electrode, and crossing over an upper surface of the gate electrode. The method further comprises forming a polysilicon thin film along an upper surface and a sidewall of the one or more dielectric layers and patterning the polysilicon thin film and the one or more dielectric layers to form a spacer and a field plate along an upper surface of the substrate between the drain region and the gate electrode, extending along a gate sidewall closer to the drain region, and further extending laterally to cover a portion of an upper surface of the gate electrode. The method further comprises performing a silicide process to the source region, the drain region, the gate electrode and the field plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   a source region and a drain region disposed within a substrate;
   a gate electrode disposed between the source region and the drain region;
   a spacer comprising a lower lateral portion disposed along an upper surface of the substrate between the gate electrode and the drain region, a vertical portion extending along a sidewall of the gate electrode, and an upper lateral portion extending from the vertical portion to an outermost sidewall of the spacer that is directly over the gate electrode;
   a field plate disposed along an upper surface and a sidewall of the spacer and separated from the gate electrode and the substrate by the spacer, wherein the field plate comprises a polysilicon layer and a metal silicide disposed on and completely covering an upper surface of the polysilicon layer;
   a first inter-level dielectric (ILD) layer overlying the substrate, the gate electrode, and the field plate;
   a first conductive contact having opposing outermost sidewalls intersecting a first horizontally extending surface of the field plate between the gate electrode and the drain region;
   a second conductive contact having opposing outermost sidewalls intersecting a second horizontally extending surface of the field plate;

wherein the first and second conductive contacts extend upward and are separated by a portion of the first ILD layer; and wherein the second horizontally extending surface of the field plate overlies the first horizontally extending surface of the field plate.

2. The transistor device of claim 1, wherein the first ILD layer is directly between and contacting both the first conductive contact and a sidewall of the field plate.

3. The transistor device of claim 1, wherein the polysilicon layer has a thickness that is between approximately 30 Angstroms and approximately 3000 Angstroms.

4. The transistor device of claim 1, further comprising:
a first doped region having a first doping type, wherein the first doped region physically contacts opposing sides and a bottom of the source region; and
a second doped region having a second doping type, wherein the second doped region physically contacts a side and a bottom of the drain region; and
wherein the first doped region physically contacts the second doped region directly below both the field plate and the gate electrode.

5. The transistor device of claim 1, wherein the metal silicide is cobalt silicide.

6. The transistor device of claim 1, wherein the spacer comprises a first oxide having a sidewall that physically contacts the gate electrode and an underlying gate dielectric along a length of the sidewall, a nitride covering a top of the first oxide, and a second oxide covering a top of the nitride, the second oxide completely separating the nitride from the polysilicon layer.

7. The transistor device of claim 1, further comprising:
a second silicide disposed on the drain region and completely confined above a top of the drain region, wherein the spacer laterally contacts the second silicide.

8. The transistor device of claim 1, further comprising:
a third conductive contact over the gate electrode, wherein the first ILD layer continuously extends from the first conductive contact to between the third conductive contact and the field plate.

9. A transistor device, comprising:
a source region and a drain region disposed within a substrate;
a gate electrode disposed between the source region and the drain region;
a spacer continuously extending between a first outermost sidewall that is between the gate electrode and the drain region and a second outermost sidewall directly over the gate electrode;
a field plate disposed along an upper surface and a sidewall of the spacer;
a first inter-level dielectric (ILD) layer overlying the substrate, the gate electrode, and the field plate;
a first conductive contact physically contacting a first horizontally extending surface of the field plate between the gate electrode and the drain region, wherein the first conductive contact has a sidewall that is laterally separated from a sidewall of the field plate by the first ILD layer; and
an additional conductive contact physically contacting a topmost horizontally extending surface of the field plate that is vertically above the first horizontally extending surface of the field plate, wherein the first conductive contact and the additional conductive contact are separated by the first ILD layer along a direction that extends from the gate electrode to the drain region.

10. The transistor device of claim 9, wherein the second outermost sidewall of the spacer is laterally set-back from an outermost sidewall of the gate electrode.

11. The transistor device of claim 9, further comprising:
an etch stop layer disposed over the field plate, wherein the first conductive contact extends through the etch stop layer.

12. The transistor device of claim 9, further comprising:
a plurality of additional conductive contacts disposed on the source region, the drain region, and the gate electrode, wherein the first conductive contact has a same width as respective ones of the plurality of additional conductive contacts.

13. The transistor device of claim 9, further comprising:
a drift region disposed along an upper surface of the substrate, wherein the drift region continuously extends along the upper surface of the substrate from directly below the gate electrode to laterally past an outermost sidewall of the field plate.

14. The transistor device of claim 9, wherein the spacer comprises a first oxide layer, a second oxide layer, and a nitride layer between the first oxide layer and the second oxide layer.

15. The transistor device of claim 9, wherein the first horizontally extending surface of the field plate is coupled to the topmost horizontally extending surface of the field plate by a vertically extending sidewall disposed therebetween.

16. The transistor device of claim 9, wherein the first horizontally extending surface is vertically below a top of the gate electrode and the topmost horizontally extending surface of the field plate is vertically above the top of the gate electrode.

17. A transistor device, comprising:
a source region and a drain region disposed within a substrate;
a gate electrode disposed between the source region and the drain region;
a field plate disposed along an upper surface and a sidewall of the gate electrode and continuously extending between a first outermost sidewall that is between the gate electrode and the drain region and a second outermost sidewall directly over the gate electrode, wherein the field plate comprises a polysilicon layer and a silicide metal having lower surfaces contacting upper surfaces of the polysilicon layer, the silicide metal and the polysilicon layer having equal widths;
a first inter-level dielectric (ILD) layer overlying the substrate, the gate electrode, and the field plate;
a first conductive contact physically contacting a first horizontally extending surface of the field plate between the gate electrode and the drain region, wherein the first conductive contact has a sidewall that is laterally separated from a sidewall of the field plate by the first ILD layer; and
an additional conductive contact physically contacting a second horizontally extending surface of the field plate that is vertically above the first horizontally extending surface, wherein the first conductive contact and the additional conductive contact are separated by the first ILD layer along a direction that extends from the gate electrode to the drain region.

18. The transistor device of claim 17, wherein the first horizontally extending surface is closer to the substrate than a top surface of the gate electrode.

19. The transistor device of claim 17, wherein opposing outermost sidewalls of the polysilicon layer are laterally aligned with opposing outermost sidewalls of the silicide metal.

20. The transistor device of claim 17, further comprising:
a silicide on the gate electrode, wherein the field plate continuously and laterally extends from over the gate electrode to outside of the gate electrode and continuously and vertically extends from over the gate electrode to below a bottom of the silicide.

* * * * *